United States Patent [19]

Clymer

[11] 4,131,857
[45] Dec. 26, 1978

[54] AUTOCORRELATED PULSE PROCESSOR

[75] Inventor: John C. Clymer, Bethlehem, Pa.

[73] Assignee: Bethlehem Steel Corporation, Bethlehem, Pa.

[21] Appl. No.: 778,511

[22] Filed: Mar. 17, 1977

[51] Int. Cl.² .......................... H03K 1/02; H03K 1/10
[52] U.S. Cl. ......................................... 328/163; 328/58;
328/61; 328/164; 307/354; 307/247 A;
307/234; 324/229; 324/77 G; 73/655; 73/613;
328/112
[58] Field of Search ................. 328/58, 112, 162, 163,
328/61, 164; 307/247 A, 234, 268, 354; 324/77
G, 34 TK; 73/597, 599, 600, 613, 655, 656

[56] References Cited
U.S. PATENT DOCUMENTS

| 2,421,138 | 5/1947 | Wheeler | 328/163 |
| 3,387,221 | 6/1968 | Arberman et al. | 328/163 X |
| 3,443,232 | 5/1969 | Stinson | 328/61 |
| 3,697,759 | 10/1972 | De Cock | 250/209 |
| 3,838,297 | 9/1974 | Bardo et al. | 307/268 |
| 3,904,894 | 9/1975 | Ciolli | 328/61 X |
| 3,907,439 | 9/1975 | Zanoni | 356/160 |
| 3,925,682 | 12/1975 | Hamada | 307/247 A |
| 3,968,681 | 7/1976 | Cornforth et al. | 73/620 |

*Primary Examiner*—John S. Heyman
*Attorney, Agent, or Firm*—Joseph J. O'Keefe; John I. Iverson; George G. Dower

[57] ABSTRACT

Electro-optical gaging system has an electronic camera which develops a raw camera pulse having a width that approximates the dimension between edges of an object imaged on the camera. A camera pulse processor employs edge detecting techniques using raw pulse differentiators, threshold detectors, zero cross-over detectors, and an autocorrelator to eliminate differentiator-generated noise. This processor produces a precise output pulse that accurately defines the object edge dimension and may be used to drive A/D measuring and/or converting circuits.

6 Claims, 4 Drawing Figures

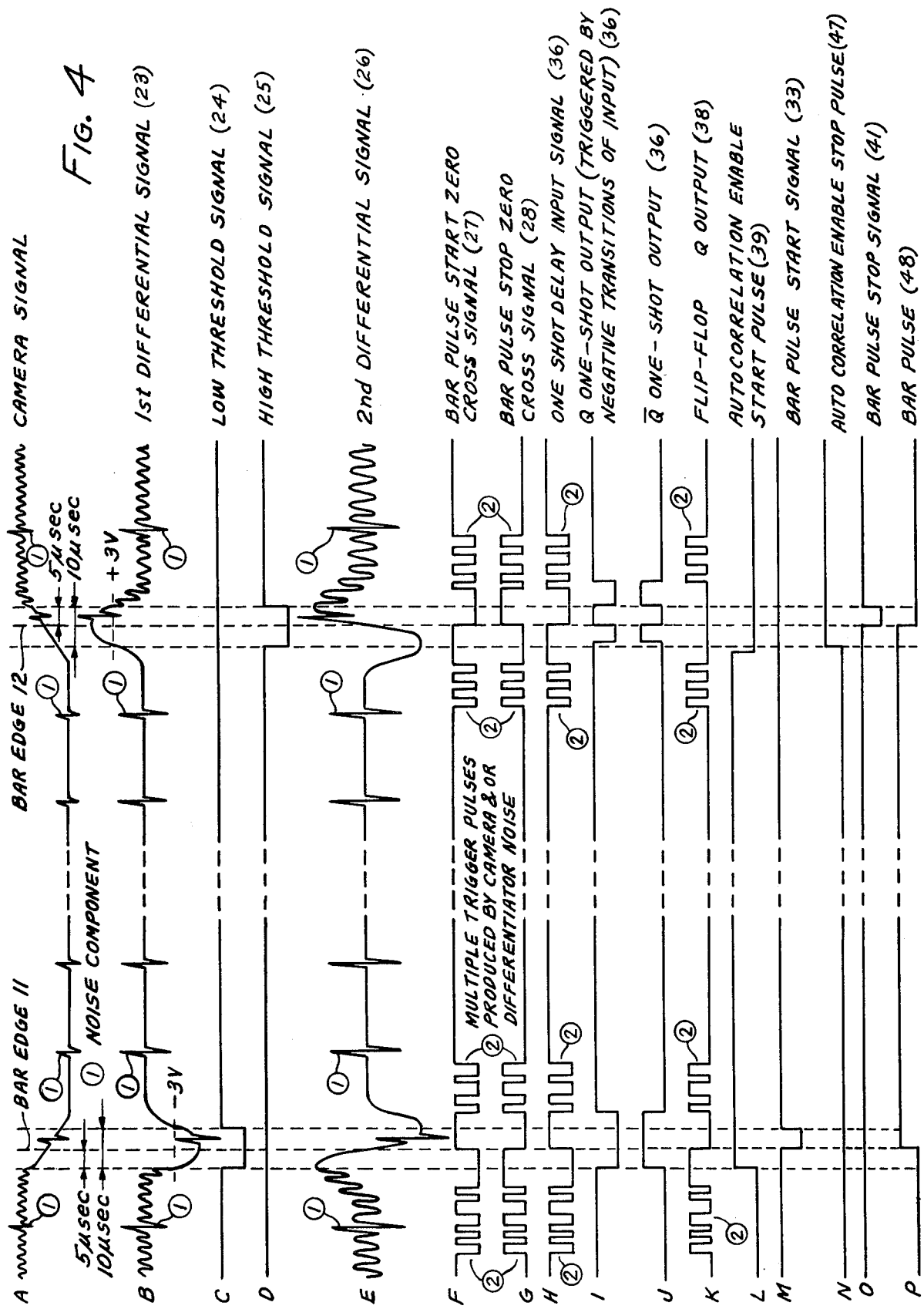

AUTOCORRELATED PULSE PROCESSOR

BACKGROUND OF THE INVENTION

1. Field of the Invention

This invention relates broadly to a pulse processor, and more particularly to an autocorrelated pulse processor suitable for use with electro-optical gaging systems and the like.

2. Description of the Prior Art

Electro-optical gaging systems are used in a variety of industrial applications. Many such gaging systems operate on the principle of back lighting an object to be measured and imaging a shadow of the object through a lens onto the face of an electronic camera. A photoresponsive image detector in the camera generates a raw camera pulse having a width that approximates the dimension between shadow edges. Raw camera pulses are processed in edge detection circuitry which attempts to more closely define camera pulse width in relation to the object dimension.

Early attempts at dimensional gaging comprised chopped light sources, a photocell detector and an image pulse processor involving pulse differentiation in an edge detection circuit. This gaging arrangement was slow in responding to object dimensional changes, possessed a great deal of differentiator noise and exhibited unsatisfactory gage accuracy for many applications. Later developments aimed at improving the differentiator noise problem involved the addition of a comparator and gate to the differentiator in edge detection circuitry met with some limited success.

However, none of the prior art pulse processors is entirely suitable for use in dimensional gages to be installed in contemporary high-speed steel bar rolling mills. In order to meet bar dimensional control requirements, measurements must be made at high repetitive speeds of about 300 Hz in the rolling mill environment. Considerable switching noise occurs at such measuring speeds, and differentiator noise is particularly troublesome. Electrical noises in the severe environment of the rolling mill further compound the problem of making definitive bar measurements at high accuracy, high resolution and high reliability. None of the prior art pulse processing arrangements met these requirements.

SUMMARY OF THE INVENTION

A main object of this invention is to provide an improved camera pulse processor that can be used in electro-optical dimensional gages operating at high measuring speeds.

One other object of this invention is to provide an improved camera pulse processor that will impart greater accuracy and reliability to high-speed electro-optical dimensional measurements in severe environments.

The foregoing objects may advantageously be attained by providing a pulse processor for an electro-optical dimensional gage having pulse differentiators, pulse threshold detectors and zero cross-over detectors feeding a fixed time-delay autocorrelator. The autocorrelator eliminates the noise problems, produces a precise pulse having a width accurately defining the dimension between edges of the object being gaged and is entirely suitable for high speed measurements in a steel mill environment.

BRIEF DESCRIPTION OF THE DRAWINGS

FIG. 4 is a timing diagram (not to scale) where signals A to O are typical waveforms representative of input, processing and output signals associated with the pulse processor of the present invention.

DESCRIPTION OF THE PREFERRED EMBODIMENT

Figure 1:
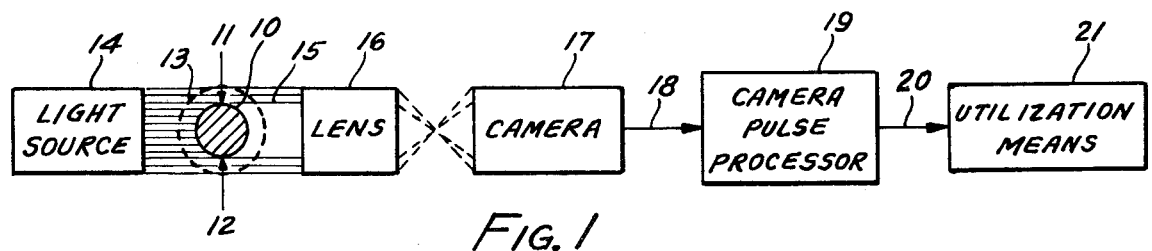
FIG. 1 is a block diagram of a typical electro-optical dimensional gage used to determine the diameter of rolled bars.

Referring now to the drawings, particularly FIG. 1, there is shown a back-lighted electro-optical gaging system suitable for measuring the lateral dimension of bar 10 between its edges 11 and 12. An end view of bar 10 makes it appear stationary but, in actual practice in a steel bar rolling mill, bar 10 vibrates laterally in orbit 13 while traveling longitudinally at speeds up to 3000 ft./min. (914 m./min.). Generally, bar orbit 13 establishes a requirement for a wider field-of-view than stationary bars, thus further compounding the problems of making precision measurements in the bar gaging system.

Light source 14 back lights bar 10 with sufficient intensity to produce a sharp horizontal bar shadow 15 that varies vertically proportional to the lateral bar dimension between bar edges 11 and 12. Bar shadow 15 will also be displaced vertically as bar 10 moves vertically in orbit 13. For this reason, lens system 16 is provided with a wide field-of-view for imaging a vertically-variable and vertically-displaceable bar shadow 13 onto a light-transmitting face of electronic camera 17.

Electronic camera 17 includes a photoresponsive device in its face which receives bar shadow 13 and is provided with appropriate scanning means designed to scan at least the entire field-of-view. The photoresponsive device in electronic camera 17 may be either an image dissector tube, or a photodiode array. Regardless of which type device is selected, it must have high response speed and high resolution characteristics. In addition, it must be capable of being scanned at rates of up to about 300 Hz. in order to make repetitive bar measurements needed to ultimately supply an automated bar rolling mill. Under these conditions, electronic camera 17 will produce a raw video camera pulse on lead 18 which may also include electrical noise from environmental sources. Nontheless, the raw camera pulse generally has a width that varies proportional to the lateral dimension between bar edges 11 and 12.

Camera pulse processor 19 converts the raw camera pulse on lead 18 into a precise bar output pulse on lead 20 that has a width with well-defined edges that accurately represents the dimensional relationship between bar edges 11 and 12. Because of the differentiator, autocorrelator and other design features described below, camera pulse processor 19 is very well suited to process the raw camera pulses at the camera scanning rate of up to about 300 Hz., yet eliminate the effects of camera signal and differentiator noises.

The precise camera output pulse on lead 20 may be fed to various utilization devices such as means 21.

Means 21 may be limited to a gate-controlled counter calibrated to bar 10 lateral dimensions, or extended to include a bar mill dimensional controller.

Figure 2:
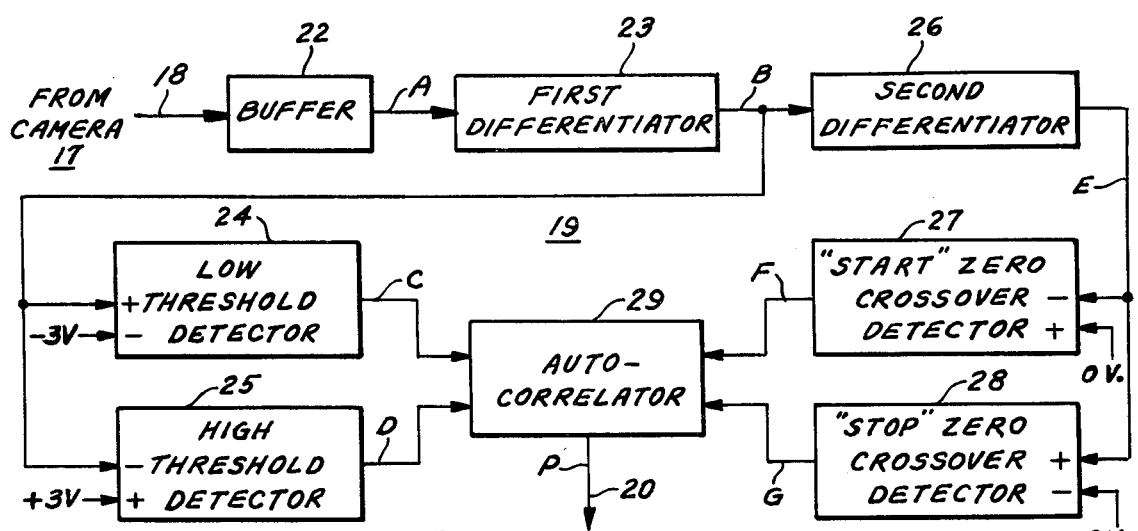
FIG. 2 is a block diagram of a camera pulse processor of the present invention which is suitable for use in the FIG. 1 embodiment.

Turning now to FIG. 2, camera pulse processor 19 is shown in block diagram form where alpha designations refer to FIG. 4 waveforms. The raw camera signal from lead 18 is buffered and amplified by buffer 22 to produce signal A. The A signal is differentiated and inverted by first differentiator 23 which has an output B. The first differential signal B is fed to low and high threshold detectors 24 and 25 which have respective outputs C and D. Threshold detectors 24 and 25 produce output signals when their plus (+) input has a lower voltage than their minus (−) input.

The first differentiated signal B is differentiated again in second differentiator 26 to produce output E. The second differentiated signal E is fed to start and stop zero cross-over detectors 27 and 28. These detectors are set up to trigger on positive and negative zero crossing transitions greater than 1 mv., thereby producing bar pulse start zero and stop zero outputs F and G, respectively. The bar pulse start zero and stop zero outputs F and G, together with low and high threshold signals C and D, are fed to fixed-delay autocorrelator 29. Bar pulse start zero and stop zero signals F and G are processed internally in respective autocorrelator circuits as will be described below. Low and high threshold signals C and D define narrow windows during which the bar pulse start and stop signals M and O are triggered, thereby establishing precise timing for the leading and trailing edges of bar output pulse P on lead 20.

As mentioned above, electronic camera 17 signal on lead 18 may also contain electrical noise. This may be high frequency, low amplitude noise which is frequently coupled magnetically into the electronic camera signal from high-current, SCR-fired, mill drive motor controllers located near electronic camera 17. Without fixed-delay autocorrelator 29, this noise will cause false triggering of bar output pulse P. For example, when a transition of camera signal A produces a first differentiated voltage B lower than a −3 volt threshold of detector 24, a low threshold signal C would be enabled which will allow start zero crossing detector 27 to generate a bar output pulse start trigger signal. Since the gain of differentiators 23 and 26 increases with input frequency, a low-amplitude, high-frequency noise spike may produce a first differentiator 23 output signal B lower than the −3 volt threshold of detector 24. This is precisely what will happen in rolling mill environments without enhancement of bar pulse generating circuitry.

Figure 3:
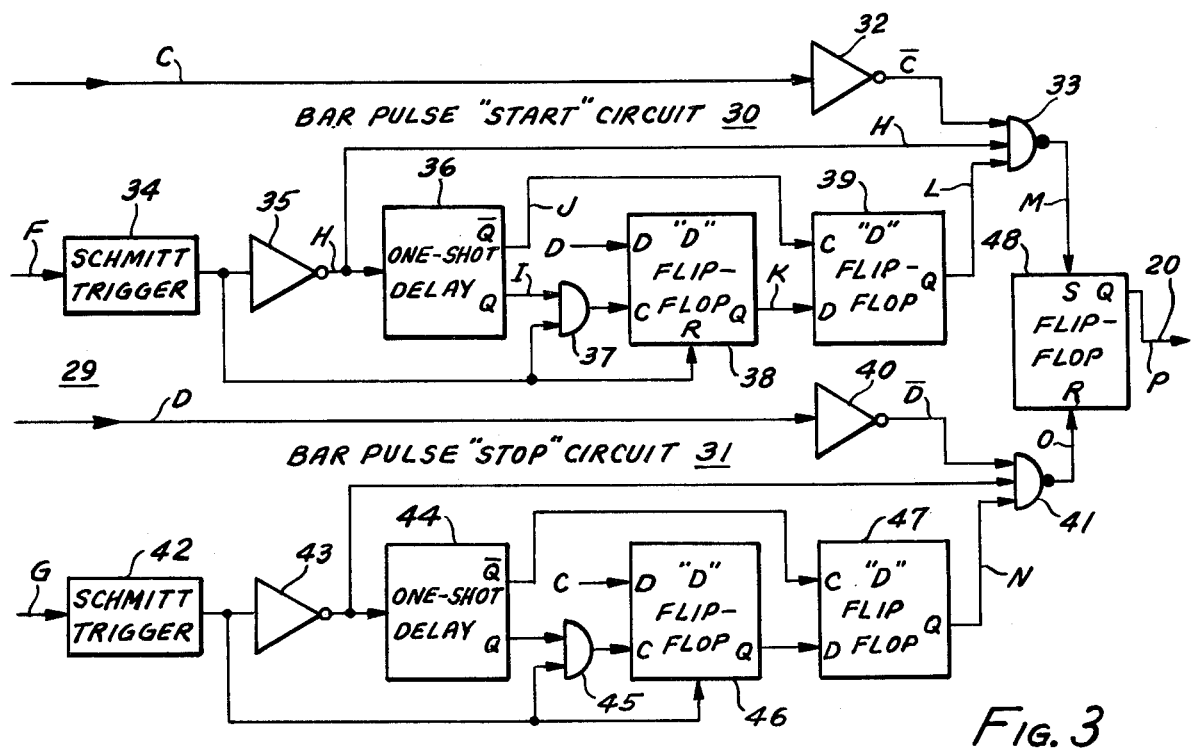
FIG. 3 is a schematic diagram of a fixed time-delay autocorrelator used in the FIG. 2 camera pulse processor.

For this reason, the fixed-delay autocorrelator 29 included in raw camera pulse processor 19 actually includes separate autocorrelator bar pulse start and stop circuits 30 and 31, respectively, as shown in FIG. 3. Bar pulse start and stop circuits 30 and 31 are provided to discriminate between second differentiated signals E generated by high frequency noise from those generated by valid bar pulse signals. During the falling edge of camera signal A, the second differentiated signal E rises to a positive voltage for about 10 microseconds before swinging to a negative voltage. For illustrative reasons, this detail is not shown to scale in FIG. 4 signal E waveform. Zero crossing detection of the second differentiated signal E by detectors 27 and 28 is the trigger point for the start and stop bar pulses of signals M and O, thereby establishing the leading and trailing edges of bar output pulse P.

Autocorrelator bar start and stop circuits 30 and 31 take advantage of the respective 10 microsecond rise and fall period of second differentiated signal E. This is done by generating autocorrelator enable start and stop signals L and N as described below. Autocorrelator start enable signal L is generated when second differentiated signal E is continuously positive for at least one-half of this 10 microsecond period before swinging negative. Similarly, autocorrelator stop enable signal N is generated when second differentiated signal E is continuously negative for at least one-half of the 10 microsecond period before swinging positive.

Autocorrelator start and stop enable signals L and N are logically "anded" in circuits 30 and 31 with respective low threshold signals C and D and bar pulse start and stop zero crossing signals F and G to generate bar pulse start and stop signals M and O. These signals cause the precise generation of bar output pulse P. It will now be apparent that high frequency noise which causes respective positive and negative excursions of the second differentiated signal E of less than 5 microseconds duration will not generate autocorrelator enable start and stop signals L and N, thus preventing triggering of bar output pulse P.

Still referring to FIG. 3, operation of autocorrelator bar pulse start circuit 30 will now be described. Operation of autocorrelator bar pulse stop circuit 31 is identical to circuit 30 with the exception that it responds to a second differentiated signal E which is continuously negative for 10 microseconds before swinging positive. Both circuits 30 and 31 employ conventional logic devices.

Low threshold signal C is inverted in amplifier 32 and fed to one of three inputs of NAND gate 33, the latter providing the bar pulse start signal M under proper logic conditions.

Bar pulse start zero crossing signal F is conditioned in Schmitt trigger 34 and inverted in amplifier 35, thereby producing trigger signal H which is fed to NAND gate 33 and one-shot delay device 36. A negative going transition of signal H triggers one-shot delay device 36 which produces a 5 microsecond logic "1" pulse I at Q output, and a 5 microsecond logic "0" pulse J at Q̄ output. Pulse I is fed to one of two inputs to AND gate 37. Schmitt trigger 34 output is also fed to the other input of AND gate 37 as well as to the reset input of flip-flop device 38. Pulse J is fed to the clock input of flip-flop device 39. The high threshold signal D is wired to the data input of flip-flop 38 to enable the autocorrelator start circuit 30 during the falling edge of camera signal A and disable this circuit during the rising edge of signal A.

If signal H is going negative, the input to inverter 35 is going positive. This positive going action removes the reset condition on flip-flop 38 and puts a logic "1" on one input of AND gate 37. Gate 37 will now pass pulse I to the clock input of flip-flop 38, thus forcing a logic "1" pulse K at Q output. After a 5 microsecond delay, one-shot delay 36 will time out, thereby causing output Q to change state and go to a logic "1" pulse J. This action also clocks the input of flip-flop device 39 which has its data input fed by signal K from the Q output flip-flop device 38.

If signal K is a logic "1", flip-flop 39 output Q will be set, thereby producing start enable signal L. Signal L, which was generated from signal H, is logically combined with signals H and C, the inverted low threshold signal, in NAND gate 33 to produce the bar pulse start signal M. Thus, it will now be readily recognizable that a bar pulse signal is delayed, then combined with itself to perform a fixed-delay autocorrelation function.

If during the 5 microsecond period controlled by one-shot delay device 36, the output of Schmitt trigger 34 goes low, indicating that the second differentiated signal E is too narrow to be a valid bar signal, the reset of flip-flop 38 goes low and forces signal K to a logic "0". When one-shot delay device 36 times out after 5 microseconds, signal J will clock flip-flop 39 with its data input in a low state. This will force the Q output of flip-flop 14 to a logic "0" and prevents any further processing of the bar signal.

One-shot delay device 36 is retriggerable so that it may accommodate consecutive triggering pulses H. If multiple trigger pulses having a short duration of less than 5 microseconds trigger one-shot delay device 36, Q output signal I will stay high for all pulses and finally time-out 5 microseconds after the last triggering pulse. AND gate 37 allows flip-flop 38 to re-clock itself on each pulse. Since the output of one-shot delay device 36 stays high continuously during these multiple triggering pulses, the combining of signal I with the Schmitt triggering pulse in AND gate 37 guarantees that the clock line on flip-flop 38 will undergo a logic transition from "0" to "1" for each triggering pulse.

As noted above, the bar pulse stop circuit 31 was identical with circuit 30, the exception being that stop circuit 31 is triggered by a continuous negative going second differentiated signal E before swing positive. For this reason, it will be apparent to those skilled in the art that inverter 40, NAND gate 41, Schmitt trigger 42, inverter 43, one-shot delay 44, AND gate 45, flip-flop 46, and flip-flop 48 devices have construction and operating features the same as their counterpart in circuit 30. Therefore, it is felt an explanation of these devices is unnecessary to show how NAND gate 41 produces the bar pulse stop signal O.

Having eliminated both the electrical noise in the raw camera bar pulse signal and the noise produced by differentiators 23 and 26, the bar pulse start and stop signals M and O produced in respective circuits 30 and 31 now precisely define the timing of bar pulse leading and trailing edges in relation to bar edges 11 and 12. Therefore, signals M and O are fed respectively to the set and reset inputs of flip-flop device 48. The Q output of device 48 provides a precise bar output pulse P on lead 20 whose leading and trailing edges are free of noise and accurately define the lateral dimension of bar 10.

I claim:

1. In gaging apparatus for generating a gaging signal having a variablewidth dimension pulse modified by a noise component, a pulse processor comprising:
 (a) first circuit means receiving the gaging signal for producing start signals responsive to detecting a leading edge of the dimensional pulse,
 (b) second circuit means associated with the first circuit means for producing stop signals responsive to detecting a trailing edge of the dimensional pulse,
 (c) either the timing or waveform, or both, of each said dimensional pulse edges being modifiable by noise, and
 (d) autocorrelator means connected to the first and second circuit means for removing noise therefrom, and including separate start and stop circuit means responsive to the start and stop signals for producing a variable-width output pulse having precisely occurring leading and trailing edges unaffected by noise and which accurately define a gaging dimension.

2. In gaging apparatus for generating a gaging signal having a variable-width dimension pulse modified by a noise component, a pulse processor comprising:
 (a) means for conditioning the gaging signal including differentiator means for producing separate first and second differentiated gaging signals,
 (b) threshold detector means responsive to the first differentiated signal for producing separate low and high threshold signals whenever the apparent leading and trailing edges of the first differentiated dimensional pulse exceeded a corresponding threshold,
 (c) zero-crossover detector means responsive to the second differentiated signal for producing separate start and stop zerocross signals whenever the apparent leading and trailing edges of the second differentiated dimensional pulse crosses a zero reference,
 (d) either the timing or waveform, or both, of each said dimensional pulse edges being modifiable by noise, and
 (e) autocorrelator means receiving the low and high threshold signals and the start and stop zero-cross signals for removing noise therefrom and for producing a variable-width output pulse having precisely occurring leading and trailing edges which accurately define a gaging dimension.

3. The pulse processor of claim 2 wherein the noise removed by the autocorrelator means includes the gaging signal noise component and differentiator-generator noise as well.

4. The pulse processor of claim 2 wherein the autocorrelator means includes:
 1. an output pulse start circuit responsive to the low threshold signal and the start zero-cross signal, and
 2. an output pulse stop circuit responsive to the high threshold signal and the stop zero-cross signal.

5. The pulse processor of claim 4 wherein at least one of the autocorrelator start and stop circuits includes logic means for summing one of the zero-cross signals with a fixed-delay of itself.

6. The pulse processor of claim 5 wherein the logic means also sums one of the threshold signals.

* * * * *

UNITED STATES PATENT AND TRADEMARK OFFICE
CERTIFICATE OF CORRECTION

PATENT NO. : 4,131,857
DATED : December 26, 1978
INVENTOR(S) : John C. Clymer

It is certified that error appears in the above-identified patent and that said Letters Patent are hereby corrected as shown below:

Col. 4, line 43, at "Q" should read --at $\bar{Q}$--.

Col. 4, line 60, "Q" should read --$\bar{Q}$--.

Col. 4, line 67, "C" should read --$\bar{C}$--.

Col. 6, subparagraph (c), claim 2, line 28, "zerocross" should be hyphenated --zero-cross--.

Col. 6, claim 3, line 44, "generator" should read --generated--.

Signed and Sealed this

Twenty-sixth Day of June 1979

[SEAL]

Attest:

RUTH C. MASON
Attesting Officer

DONALD W. BANNER
Commissioner of Patents and Trademarks